United States Patent
Park et al.

(10) Patent No.: US 9,287,217 B2
(45) Date of Patent: Mar. 15, 2016

(54) DICING DIE-BONDING FILM AND METHOD OF FORMING A CUT ON THE DICING DIE-BONDING FILM

(71) Applicants: Baek Soung Park, Uiwang-si (KR); Jae Won Choi, Uiwang-si (KR); Sung Min Kim, Uiwang-si (KR); In Hwan Kim, Uiwang-si (KR); Jun Woo Lee, Uiwang-si (KR); Su Ml Im, Uiwang-si (KR)

(72) Inventors: Baek Soung Park, Uiwang-si (KR); Jae Won Choi, Uiwang-si (KR); Sung Min Kim, Uiwang-si (KR); In Hwan Kim, Uiwang-si (KR); Jun Woo Lee, Uiwang-si (KR); Su Ml Im, Uiwang-si (KR)

(73) Assignee: CHEIL INDUSTRIES, INC., Gumi-si, Kyeongsangbuk-do (KR)

( * ) Notice: Subject to any disclaimer, the term of this patent is extended or adjusted under 35 U.S.C. 154(b) by 75 days.

(21) Appl. No.: 14/315,495

(22) Filed: Jun. 26, 2014

(65) Prior Publication Data
US 2014/0306357 A1   Oct. 16, 2014

Related U.S. Application Data

(63) Continuation of application No. PCT/KR2012/011108, filed on Dec. 18, 2012.

(30) Foreign Application Priority Data

Dec. 27, 2011   (KR) .................. 10-2011-0143455

(51) Int. Cl.
*H01L 23/544*   (2006.01)
*H01L 21/70*   (2006.01)
*C09J 7/02*   (2006.01)
*H01L 21/683*   (2006.01)
*H01L 23/00*   (2006.01)

(52) U.S. Cl.
CPC .................. *H01L 23/544* (2013.01); *C09J 7/02* (2013.01); *H01L 21/6836* (2013.01); *H01L 21/70* (2013.01); *H01L 24/27* (2013.01); *C09J 2201/28* (2013.01); *C09J 2201/36* (2013.01); *C09J 2203/326* (2013.01); *H01L 2221/68327* (2013.01); *H01L 2224/83191* (2013.01)

(58) Field of Classification Search
CPC ..... H01L 21/70; H01L 21/6836; H01L 24/27; H01L 2221/68327; C09J 7/02; C09J 2203/326; C09J 2201/28; C09J 2201/36
See application file for complete search history.

(56) References Cited

U.S. PATENT DOCUMENTS

2012/0024469 A1* 2/2012 Takamoto .................. C09J 7/02
                                                              156/249
2012/0171844 A1* 7/2012 Hwang .................. C09J 7/0246
                                                              438/465

* cited by examiner

*Primary Examiner* — Peniel M Gumedzoe
(74) *Attorney, Agent, or Firm* — Lee & Morse, P.C.

(57) ABSTRACT

A dicing die-bonding film and a method of forming a groove in a dicing die-bonding film, the film including a base film; a pressure-sensitive adhesive layer stacked on the base film; and a bonding layer stacked on the pressure-sensitive adhesive layer, wherein the pressure-sensitive adhesive layer includes a first region overlapping with the bonding layer, and a second region not overlapping with the bonding layer, the second region including a third region adjacent to the first region, and a fourth region adjacent to the third region and having a groove formed therein.

21 Claims, 5 Drawing Sheets

DICING DIE-BONDING FILM AND METHOD OF FORMING A CUT ON THE DICING DIE-BONDING FILM

CROSS-REFERENCE TO RELATED APPLICATION

This application is a continuation of pending International Application No. PCT/KR2012/011108, entitled "Dicing Die-Bonding Film and Method for Forming Cut On the Dicing Die-Bonding Film," which was filed on Dec. 18, 2012, the entire contents of which are hereby incorporated by reference.

Korean Patent Application No. 10-2011-0143455, filed on Dec. 27, 2011, in the Korean Intellectual Property Office, and entitled: "Dicing Die-Bonding Film and Method for Forming Cut On the Dicing Die-Bonding Film," is incorporated by reference herein in its entirety.

BACKGROUND

1. Field

Embodiments relate to a dicing die-bonding film and a method of forming a cut on the dicing die bonding film.

2. Description of the Related Art

Dicing die-bonding films used for a semiconductor manufacturing process may be classified into a UV type film (being cured by UV exposure) and a non-UV type film (in which UV exposure is not used).

UV type films may exhibit excellent adhesion before photo-curing and thus may provide excellent cutting proccessability. However, UV type films use UV exposure in order to perform a pick-up process after the cutting process, thereby complicating the manufacturing process. In manufacture of semiconductor packages, the UV exposure process (performed before the pick-up process) may take a long time and may have a significant influence on improvement in productivity of semiconductor packages. In addition, in the event that a UV irradiator malfunctions in the course of UV exposure, some wafers arranged in a lot may receive insufficient UV energy, thereby causing pick-up failure, by which sawed semiconductor chips are not separated from a dicing film layer (pressure-sensitive adhesive layer) in the pick-up process.

SUMMARY

Embodiments are directed to a dicing die-bonding film and a method of forming a cut on the dicing die bonding film.

The embodiments may be realized by providing a dicing die-bonding film including a base film; a pressure-sensitive adhesive layer stacked on the base film; and a bonding layer stacked on the pressure-sensitive adhesive layer, wherein the pressure-sensitive adhesive layer includes a first region overlapping with the bonding layer, and a second region not overlapping with the bonding layer, the second region including a third region adjacent to the first region, and a fourth region adjacent to the third region and having a groove formed therein.

A ring frame may be attached to the fourth region.

The groove may have an apex at an interface between the third region and the fourth region.

A distance from an end point of the groove to an end point of other groove neighboring the groove may range from 1 mm to 15 mm.

The groove may be formed by cutting the dicing die-bonding film along a line connecting first to third points placed at different locations on the pressure-sensitive adhesive layer in order of the first, third, and second points or in order of the second, third, and first points, the first point, the second point, and a central point of the pressure-sensitive adhesive layer may be non-collinear, and a distance (a) from the central point of the pressure-sensitive adhesive layer to the first point, a distance (b) from the central point of the pressure-sensitive adhesive layer to the second point, a distance (c) from the central point of the pressure-sensitive adhesive layer to the third point may satisfy relationships of c<a and c<b. and a shape of the lines connecting the first to third points is a straight line, a curved line, a wavy line or an undulating line.

The distance (a) may be equal to the distance (b).

A distance between the first point and the second point may range from 1 mm to 15 mm.

A minimal distance from the first point or the second point of the groove to first point or second point of other groove neighboring the groove may range from 1 mm to 15 mm.

A vertical distance from a straight line extending between the first point and the second point to the third point may range from 1 mm to 10 mm.

The groove may have a shape selected from a semicircular shape, an elliptical shape, a curved shape, a polygonal shape, or a combination thereof.

The embodiments may also be realized by providing a dicing die-bonding film including a base film; a pressure-sensitive adhesive layer stacked on the base film; a bonding layer stacked on the pressure-sensitive adhesive layer; and a release film stacked on the bonding layer or the pressure-sensitive adhesive layer, wherein the pressure-sensitive adhesive layer includes a first region overlapping with the bonding layer, and a second region surrounding the first region without overlapping with the bonding layer, and wherein at least one groove is formed through the base film and the second region.

The groove may not penetrate the release film.

A ring frame may be attached to a section inside the second region.

A distance from an end point of the groove to an end point of other groove neighboring the groove may range from 1 mm to 15 mm.

The groove may be formed by cutting the dicing die-bonding film along a line connecting first to third points placed at different locations on the pressure-sensitive adhesive layer in order of the first, third, and second points or in order of the second, third, and first points, the first point, the second point, and a central point of the pressure-sensitive adhesive layer may be non-collinear, and a distance (a) from the central point of the pressure-sensitive adhesive layer to the first point, a distance (b) from the central point of the pressure-sensitive adhesive layer to the second point, a distance (c) from the central point of the pressure-sensitive adhesive layer to the third point may satisfy relationships of c<a and c<b, and a shape of the lines connecting the first to third points is a straight line, a curved line, a wavy line or an undulating line.

The distance (a) may be equal to the distance (b).

A distance between the first point and the second point may range from 1 mm to 15 mm.

A minimal distance from the first point or the second point of the groove to first point or second point of other groove neighboring the groove may range from 1 mm to 15 mm.

A vertical distance from a straight line extending between the first point and the second point to the third point may range from 1 mm to 10 mm.

The groove may have a shape selected from a semicircular shape, an elliptical shape, a curved shape, a polygonal shape, or a combination thereof.

The embodiments may also be realized by providing a method of forming a groove in a dicing die-bonding film that includes a base film; a pressure-sensitive adhesive layer stacked on the base film; a bonding layer stacked on the central part of the pressure-sensitive adhesive layer; and a release film stacked on the bonding layer or the pressure-sensitive adhesive layer, the method comprising inserting a knife blade into the dicing die-bonding film from the base film to a depth penetrating a region of the pressure-sensitive adhesive layer, on which the bonding layer is not stacked, without penetrating the release film.

BRIEF DESCRIPTION OF THE DRAWINGS

Features will be apparent to those of skill in the art by describing in detail exemplary embodiments with reference to the attached drawings in which.

EXAMPLE 2.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

An embodiment provides a dicing die-bonding film including, e.g., a) a base film; b) a pressure-sensitive adhesive (PSA) layer stacked on the base film; and c) a bonding layer stacked on the pressure-sensitive adhesive layer. The pressure-sensitive adhesive layer may include a first region overlapping with the bonding layer, and a second region not overlapping with the bonding layer. The second region may include a third region (adjacent to the first region) and a fourth region (adjacent to the third region) having a groove formed therein. For example, the third region may be between the fourth region and the first region.

The base film, the pressure-sensitive adhesive layer, the bonding layer, and the release film may have a suitable structure generally used for semiconductor packaging.

As used herein, the term groove may refer to a cut-away section formed along a certain open loop. For example, the open loop may be a different concept relative to a closed loop, and may mean a line segment, a starting point of which is not connected to or collocated with an end point thereof.

The groove may be formed by cutting in the third region of the pressure-sensitive adhesive layer along a line connecting first, second, and third points (placed at different locations on the third region of the pressure-sensitive adhesive layer) in order of the first, third, and second points or in order of the second, third, and first points. In an implementation, the first point, the second point, and a central point of the pressure-sensitive adhesive layer may not be collinearly placed on a straight line; and a distance (a) from the central point of the pressure-sensitive adhesive layer to the first point, a distance (b) from the central point of the pressure-sensitive adhesive layer to the second point, a distance (c) from the central point of the pressure-sensitive adhesive layer to the third point may satisfy relationships of c<a and c<b, and a shape of the lines connecting the first to third points is a straight line, a curved line, a wavy line or an undulating line.

Figure 1:
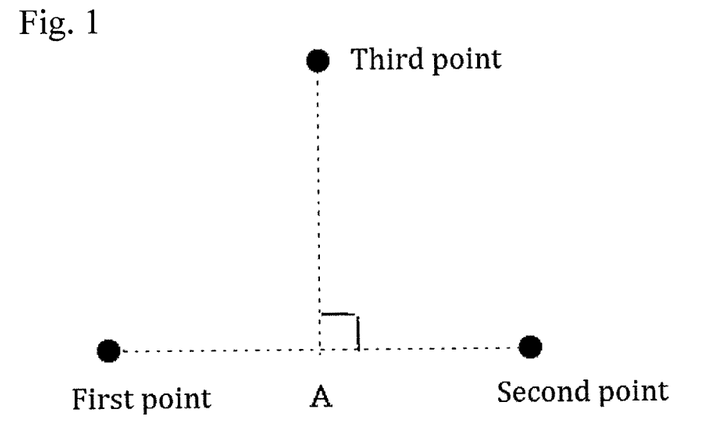
FIG. 1 illustrates first and second points placed at opposite ends of a cut-away section of groove, and a third point placed at a certain location on a cut-away section of a dicing die-bonding film.

Referring to FIG. 1, the groove may be formed by cutting into the pressure-sensitive adhesive layer along a certain line connecting the first point, the second point, and the third point in order of the first point-third point-second points, or in order of the second point-third point-first point. For example, when connecting the three points, the first point may not be directly connected to the second point without passing through the third point. A shape of the line connecting these points is not particularly limited, and may include, e.g., a straight line, a curved line, a wavy line, an undulating line, or the like.

Referring to FIG. 1, all of the first to third points may be within the fourth region of the pressure-sensitive adhesive layer.

Figure 3A:
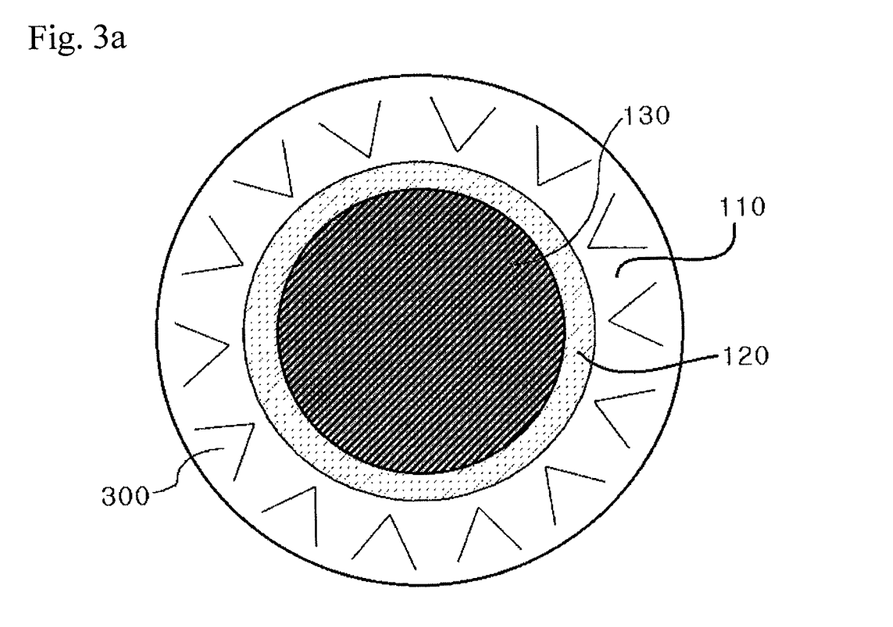
FIGS. 3a and 3b illustrate schematic views of a dicing die-bonding film having a groove formed therein in accordance with an embodiment.
Figure 3B:
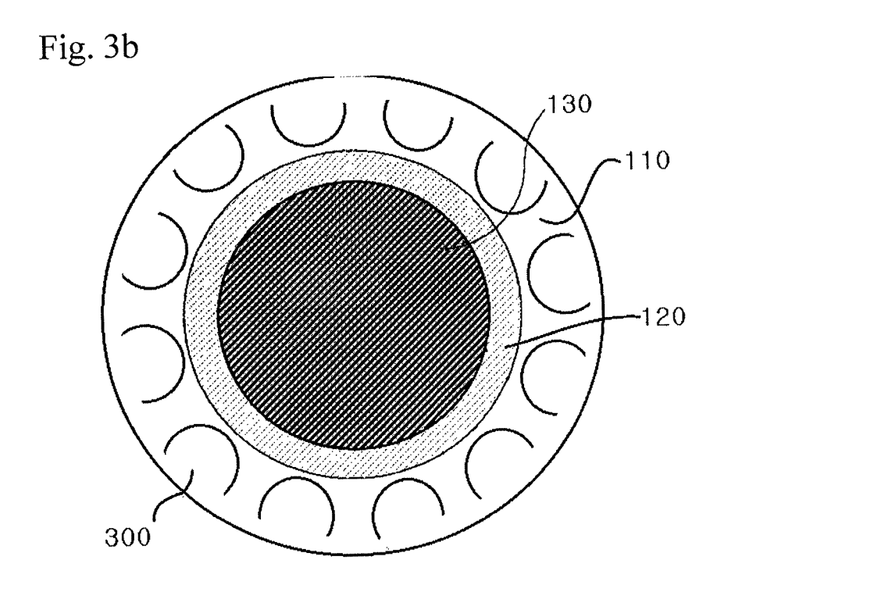

For example, referring to FIGS. 3a and 3b, the pressure-sensitive adhesive layer of the dicing die-bonding film may be divided into or include a first region 130 (overlapping with a bonding layer) and a second region (not overlapping with the bonding layer and not yet attached to a ring frame). In addition, the second region may be divided into or include a third region 120 (adjacent to the first region 130) and a fourth region 110 (adjacent to the third region 120) having grooves formed thereon. For example, the third region 120 may be between the first region 130 and the fourth region 110. The fourth region 110 may be an outermost section of the pressure-sensitive adhesive layer of the dicing die-bonding film. The ring frame (not illustrated) to be attached to the fourth region 110 may have a thickness or width of, e.g., about 20 mm. Thus, the fourth region 110 may correspond to a region within about 20 mm from an outermost edge of the pressure-sensitive adhesive layer of the dicing die-bonding film.

If one of the first to third points were to be outside the fourth region 110 of the pressure-sensitive adhesive layer, grooves 300 would be formed outside of the fourth region of the pressure-sensitive adhesive layer (see FIG. 4), so that the pressure-sensitive adhesive layer may be separated from the ring frame in a semiconductor manufacturing process, thereby causing undesirable process failure or damage to the pressure-sensitive adhesive layer during the process.

Thus, according to an embodiment, the first to third points may be inside or contained within the fourth region 110 of the pressure-sensitive adhesive layer. A distance between the first point and the second point may not be particularly limited. For example, a distance between the first point and the second point may be 1 mm to 15 mm. Within this range, the grooves 300 may have a suitable size to facilitate efficient discharge of cutting water and/or air therethrough, and may be formed inside, e.g., contained entirely within, the fourth region 110 of the pressure-sensitive adhesive layer, in consideration of the relationship with the third point.

Referring to FIG. 1, all of the first point, second point, and third point may be placed inside, e.g., contained entirely within, the fourth region 110 of the pressure-sensitive adhesive layer. A distance between a point A and the third point (e.g., a shortest distance between the third point and a line that connects the first and second points) is not particularly limited. For example, a minimal distance from the first point or the second point of the groove to first point or second point of other groove neighboring the groove may range from 1 mm to 15 mm.

Specifically, the distance between the point A and the third point may be 1 mm to 10 mm. Maintaining the distance between the two points at 1 mm or greater may help ensure that the grooves have a substantially two-dimensional shape, rather than a one-dimensional or linear shape, and thus may help ensure that the grooves function properly. Maintaining the distance between the two points at 10 mm or less may help ensure that all of the first, second, and third points are contained within the fourth region 110 of the pressure-sensitive adhesive layer.

Figure 2:
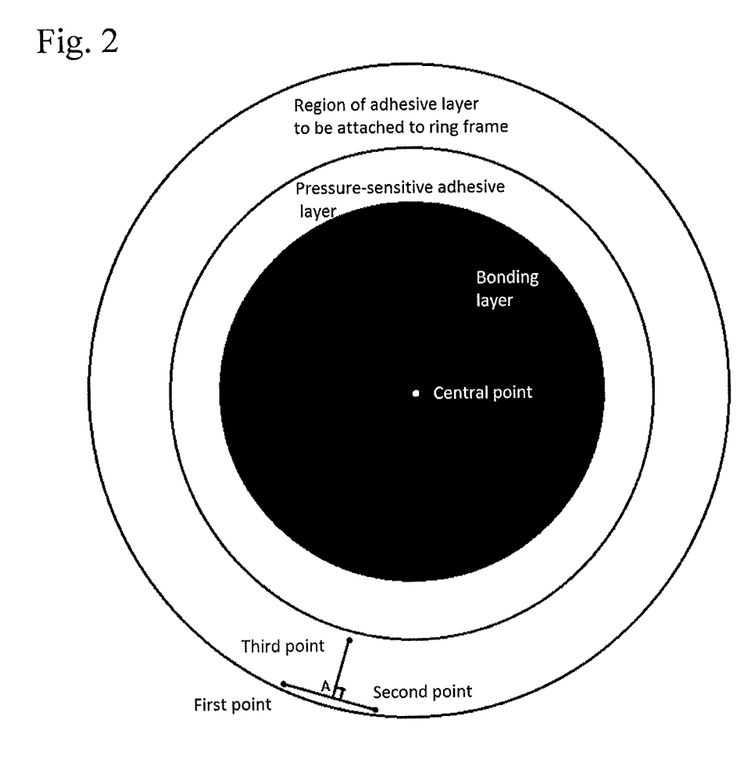
FIG. 2 illustrates a schematic diagram showing a positional relationship between the three points of FIG. 1 on the dicing die-bonding film.

Referring to FIG. 2, a distance (a) from a central point of the pressure-sensitive adhesive layer to the first point, a distance (b) from the central point of the pressure-sensitive adhesive layer to the second point, a distance (c) from the central point of the pressure-sensitive adhesive layer to the third point may satisfy relationships of c<a and c<b, and a shape of the lines connecting the first to third points is a straight line, a curved line, a wavy line or an undulating line.

The distances (a) and (b) are not particularly limited, and may be different from each other so long as both the first point and the second point are within the fourth region 110 of the pressure-sensitive adhesive layer. In an implementation, the distances (a) and (b) may be the same.

Figure 6:
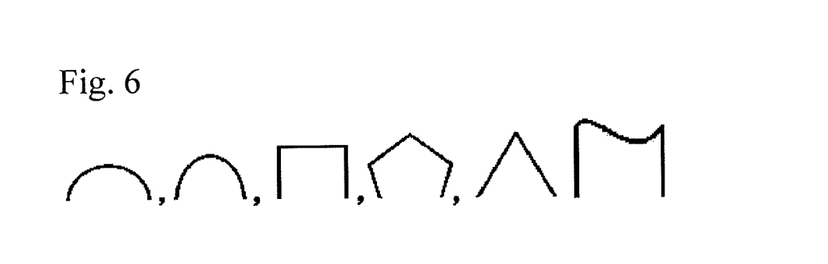
FIG. 6 illustrates shapes of the grooves according to an embodiment.

The grooves 300 may have a suitable shape without being particularly limited. Exemplary shapes of the grooves 300 may include a semicircular shape, a U-shape, an elliptical shape, a curved shape, a triangular shape, a rectangular shape, a pentagonal shape, other polygonal shapes, and combinations thereof (e.g., shapes with both straight and curved lines), when an imaginary straight line passing through the first point and the second point is taken as a lower side in FIG. 1. For example, FIG. 6 illustrates various suitable shapes for the grooves 300.

In an implementation, the grooves 300 may have a semicircular shape, a triangular shape, a rectangular shape, and/or a pentagonal shape.

A distance between the grooves 300 is not particularly limited so long as all of the grooves 300 are placed inside or contained within the fourth region 110 of the pressure-sensitive adhesive layer. In an implementation, the distance from an end point of the groove 300 to an end point of other groove 300 neighboring the groove 300 may be 1 mm to 15 mm. Within this range, it is possible to help prevent the pressure-sensitive adhesive layer from being broken due adjacent grooves 300 being connected in the semiconductor manufacturing process, and a suitable number of grooves 300 may be formed to facilitate effective discharge of cutting water and/or air therethrough.

The number of grooves 300 formed inside or contained within the fourth region 100 of the pressure-sensitive adhesive layer is not particularly limited.

The grooves 300 may be placed at a suitable location inside the fourth region 110 of the pressure-sensitive adhesive layer without being particularly limited to a certain location. In an implementation, the grooves 300 may be placed at inner regions inside the fourth region 110 (nearer to the central part of the pressure-sensitive adhesive layer). Such an arrangement may be advantageous in terms of removal of cutting water or air. In an implementation, the grooves 300 may be placed to have a highest point or apex (corresponding to the third point) at an interface between the third region and the fourth region. As used herein, the term 'highest point of the groove' or 'apex' may refer to a contour point of the groove nearest to the central part of the pressure-sensitive adhesive layer.

The grooves 300 may be formed using a pinnacle having a shape corresponding to the groove in a process of cutting the dicing die-bonding film into a standardized wafer shape and size after applying a bonding agent to the pressure-sensitive adhesive layer on the base film.

The dicing die-bonding film may be a non-UV type film.

The dicing die-bonding film may be a pre-curable non-UV type film including a pressure-sensitive adhesive layer, which may be formed of a photocurable adhesive composition and subjected to UV irradiation.

The dicing die-bonding film may be a non-photocurable non-UV type film including a pressure-sensitive adhesive layer which is formed of a non-photocurable adhesive composition.

FIGS. 3a and 3b illustrate dicing die-bonding films according to embodiments.

Although the grooves have a V-shape in FIG. 3a and a U-shape in FIG. 3b, the grooves are not particularly limited to a certain shape. For example, the grooves may have various shapes, such as those described above, polygonal, curved, and/or combinations thereof.

The areas of the pressure-sensitive adhesive layer and bonding layer, the shapes, sizes and number of the grooves 300, and the locations of the grooves inside the fourth region 110 of the pressure-sensitive adhesive layer in FIGS. 3a and 3b are not numerically calculated. For example, FIGS. 3a and 3b schematically illustrate general configurations according to the embodiments. Therefore, the embodiments should not be construed in any way as being limited to FIGS. 3a and 3b.

Another embodiment provides a dicing die-bonding film including, e.g., a) a base film; b) a pressure-sensitive adhesive layer stacked on the base film; c) a bonding layer stacked on the pressure-sensitive adhesive layer; and d) a release film stacked on the bonding layer or the pressure-sensitive adhesive layer. The pressure-sensitive adhesive layer may include a first region overlapping with the bonding layer and a second region surrounding the first region without overlapping with the bonding layer. At least one groove may be formed through the base film and the second region.

The base film, the pressure-sensitive adhesive layer, the bonding layer, and the release film are not particularly limited, and may have a suitable structure for semiconductor packaging.

Figure 5A:
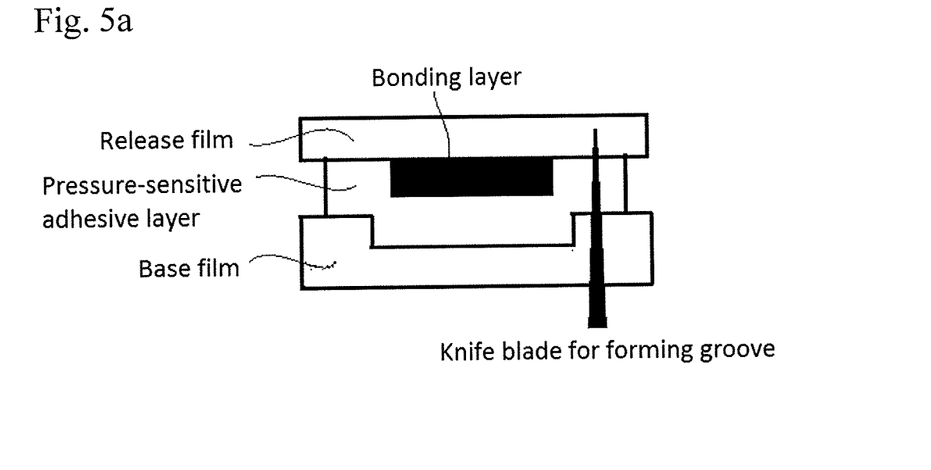
FIGS. 5a, 5b, and 5c illustrate sectional views of stages a method of forming a groove in a dicing die-bonding film.

The bonding layer may have a smaller area than the pressure-sensitive adhesive layer, and may be formed at the central part of the pressure-sensitive adhesive layer (see FIG. 5a).

As used herein, the expression "formed through" or derivatives thereof may mean that the groove is formed to completely penetrate the corresponding layer (or film).

The groove may penetrate the pressure-sensitive adhesive layer from an outer surface of the base film and may not completely penetrate the release film (stacked on the pressure-sensitive adhesive layer). For example, the groove may be formed or extend from the outer surface of the base film and may pass or extend through the pressure-sensitive adhesive layer to an interface between the pressure-sensitive adhesive layer and the release film, or to an inner portion of the release film (FIG. 5a). The groove may not completely penetrate the release film, e.g., all the way to or past an outer surface of the release film (as shown in FIG. 5c).

If the groove were to reach the outer surface of the release film, an open cut portion of the groove of the pressure-sensitive adhesive layer may be lifted together with the release film, and bonded inwards while the release film is stripped off in mounting process, thereby causing process failure.

In an implementation, the groove may not completely penetrate the release film, e.g., the groove may be formed or penetrate to a certain depth of the release film from the interface between the pressure-sensitive adhesive layer and the release film. In an implementation, the groove may be formed or extend from the base film only to the interface between the pressure-sensitive adhesive layer and the release film through the pressure-sensitive adhesive layer (FIG. 5b).

FIG. 5a illustrates a stage in a method of forming a groove in the dicing die-bonding film having the four-layer structure of the base film, pressure-sensitive adhesive layer, bonding layer, and release film by inserting a knife blade from the base film to a depth corresponding to an inner portion of the release film.

Figure 5B:
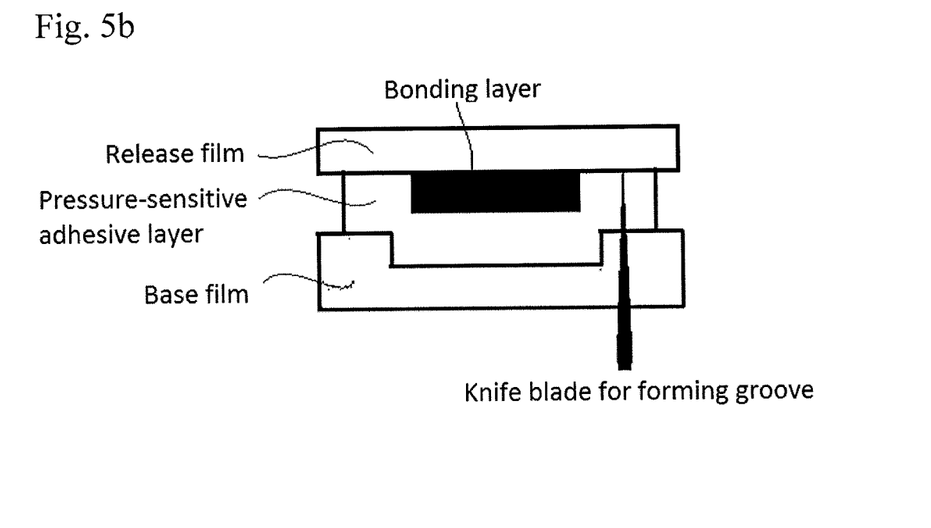
Figure 5C:
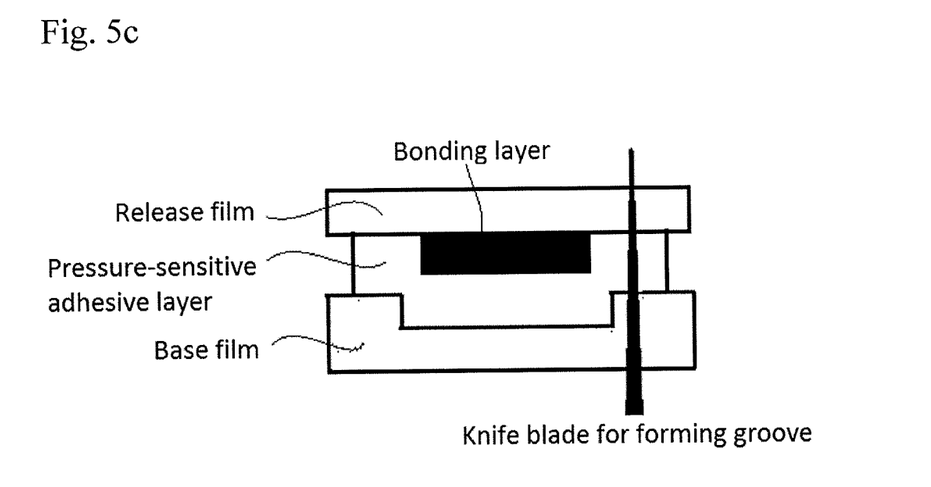

FIG. 5b illustrates a stage in a method of forming a groove in the dicing die-bonding film having the four-layer structure of the base film, pressure-sensitive adhesive layer, bonding layer, and release film by inserting a knife blade from the base film to a depth corresponding to an interface between the pressure-sensitive adhesive layer and the release film.

The shape, size, and number of grooves are not particularly limited.

The groove may placed inside or contained within the fourth region 110 of the pressure-sensitive adhesive layer.

Another embodiment provides a method for forming a groove in a dicing die-bonding film that includes a) a base film; b) a pressure-sensitive adhesive layer stacked on the base film; c) a bonding layer stacked on the central part of the pressure-sensitive adhesive layer; and d) a release film stacked on the bonding layer or the pressure-sensitive adhesive layer. The method may include inserting a knife blade into the dicing die-bonding film from the base film to a particular depth such that a region of the pressure-sensitive adhesive layer on which the bonding layer is not stacked is penetrated, without completely penetrating the release film.

The groove may be formed by inserting the knife blade into the dicing die-bonding film from the base film to an inner portion of the release film through the pressure-sensitive adhesive layer (FIG. 5a), or from the base film to a depth corresponding to the interface between the pressure-sensitive adhesive layer and the release film (FIG. 5b).

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLE 1

Formation of Groove in Region of Pressure-Sensitive Adhesive Layer to be Attached to Ring Frame In each dicing die-bonding film (obtained from Cheil Industries Inc.) having a photocurable pressure-sensitive adhesive layer and dicing die-bonding film (obtained from Cheil Industries Inc.) having a non-photocurable pressure-sensitive adhesive layer, grooves were formed in a region of the pressure-sensitive adhesive layer to be attached to a ring frame, as shown in FIG. 3a.

The grooves were formed using a pinnacle having a shape corresponding to the groove in a process of cutting the dicing die-bonding film into a standardized wafer shape and size after applying a bonding agent to the pressure-sensitive adhesive layer on the base film.

In Example 1, a dicing die-bonding film (obtained from Cheil Industries Inc.) for a ring frame having an inner diameter of 250 mm for 8-inch wafers was used. Grooves were formed in a region of a pressure-sensitive adhesive layer to be attached to the ring frame under conditions that the distance from the center of the pressure-sensitive adhesive layer to the third point was set to 128 mm, the distance between the first point and the second point was set to 5 mm, the distance from the center of the pressure-sensitive adhesive layer to the first point and the distance from the center of the pressure-sensitive adhesive layer to the second point were set to 132 mm, and the distance between the grooves was set to 5 mm.

EXAMPLE 2

Formation of Groove in Region of Pressure-Sensitive Adhesive Layer to be Attached to Ring Frame Grooves were formed in the same manner as in Example 1, except that a dicing die-bonding film (obtained from Cheil Industries Inc.) for a ring frame having an inner diameter of 350 mm for 12-inch wafers was used, the distance from the center of the pressure-sensitive adhesive layer to the third point was set to 178 mm, and the distance from the center of the pressure-sensitive adhesive layer to the first point and the distance from the center of the pressure-sensitive adhesive layer to the second point were set to 182 mm.

COMPARATIVE EXAMPLE 1

Dicing Die-Bonding Film Having no Grooves on Pressure-Sensitive Adhesive Layer

A dicing die-bonding film having a non-photocurable pressure-sensitive adhesive layer (i.e., the same as the dicing die-bonding film used in Example 1 and having no grooves thereon) was prepared.

COMPARATIVE EXAMPLE 2

Figure 4:
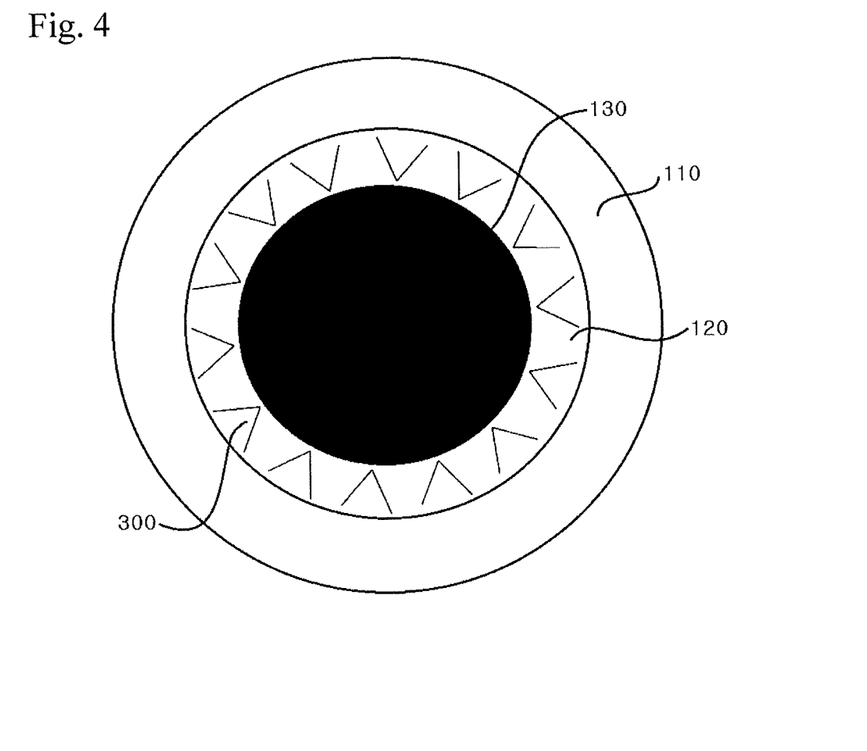
FIG. 4 illustrates a schematic view of a dicing die-bonding film prepared in Comparative

Dicing Die-Bonding Film Having Grooves Outside Region of Pressure-Sensitive Adhesive Layer to be Attached to Ring Frame Grooves were formed in the same manner as in Example 1, except that the distance from the center of the pressure-sensitive adhesive layer to the third point was set to 115 mm, the distance from the center of the pressure-sensitive adhesive layer to the first point and the distance from the center of the pressure-sensitive adhesive layer to the second point were set to 119 mm, and the grooves were placed outside a region of the pressure-sensitive adhesive layer to be attached to the ring frame, and were formed on a region of the pressure-sensitive adhesive layer on which the bonding layer is not placed (FIG. 4).

EXPERIMENTAL EXAMPLE 1

Evaluation as to Separation from Ring Frame and Water Infiltration in Sawing Process Each of the dicing die-bonding film prepared in Examples 1 and 2 and Comparative Examples 1 and 2 was attached to a ring frame and subjected to a sawing process to evaluate water infiltration and separation from the ring frame.

After the sawing process was performed using a DISCO DFD-6361 under conditions of a sawing speed of 10 mm/sec, a rate of rotation of 50,000 rpm, a hydraulic pressure of 1.6 MPa, and a water supply rate of 1.5 L/min, water infiltration and separation from the ring frame were observed by the naked eye. For example, an overall area of the region of the pressure-sensitive adhesive layer attached to the ring frame was equally divided into 12 sections. When water infiltration and separation from the ring frame occurred at two or more sections, this result was evaluated as "poor", and when water infiltration and separation from the ring frame occurred at 0 or 1 section, the result was evaluated as "good".

EXPERIMENTAL EXAMPLE 2

Measurement of Pick-Up Success Rate

The pick-up process refers to a process of mounting wafer chips on a PCB or other chips after the process of sawing a wafer.

After sawing the wafer according to the method of Experimental Example 1, pick-up testing was performed with respect to 100 chips placed at the central part of the sawed wafer using a die bonder SDB-1000M (Secron Co., Ltd.), and the pick-up success rate (%) was measured.

Results of Experimental Examples 1 and 2 are shown in Table 1, below.

TABLE 1

| | Example 1 | Example 2 | Comparative Example 1 | Comparative Example 2 |
|---|---|---|---|---|
| Water infiltration and separation from ring frame | Good | Good | Poor | Poor |
| Pick-up success rate (%) | 100 | 100 | 0 (impossible to evaluate) | 0 (impossible to evaluate) |

Referring to Table 1, although the dicing die-bonding films of Comparative Examples 1 and 2 had the same adhesive strength and adhesion as those of Examples 1 and 2, both the dicing die-bonding film of Comparative Example 1 (which did not include grooves), and the dicing die-bonding film of Comparative Example 2 (which included the grooves outside the region of the pressure-sensitive adhesive layer attached to the ring frame), suffered severe water infiltration due to cutting water, causing easy separation from the ring frame. Thus, the dicing die-bonding films of Comparative Examples 1 and 2 were evaluated as defective films and the pick-up success rates thereof could not be evaluated due to pick-up failure.

On the contrary, although the dicing die-bonding films of Examples 1 and 2 had the same adhesive strength and adhesion as those of Comparative Examples 1 and 2, both dicing die-bonding films of Examples 1 and 2 had the grooves in the region of the pressure-sensitive adhesive layer attached to the ring frame to allow cutting water to be discharged therethrough and thus suffered from substantially no water infiltration causing separation from the ring frame. Accordingly, the dicing die-bonding films of Examples 1 and 2 were evaluated as good films. In addition, both dicing die-bonding films had a pick-up success rate of 100%.

By way of summation and review, a non-UV type film (which may be cured without UV exposure before the pick-up process) may be used as a dicing die bonding film. However, in the non-UV type film, a pressure-sensitive adhesive layer of the film may be easily separated from the ring frame due to low adhesive strength.

The embodiments may provide a non-UV type dicing die-bonding film capable of controlling or preventing separation of a pressure-sensitive adhesive layer from a ring frame by forming a groove in a region of the pressure-sensitive adhesive layer to be attached to the ring frame such that cutting water may be discharged through the groove to thereby protect the dicing die-bonding film from infiltration by the water.

The embodiments may provide a dicing die-bonding film that includes a groove in a region of a pressure-sensitive adhesive layer to be attached to a ring frame such that the dicing die-bonding film may be protected from influence of water infiltration by cutting water, thereby controlling or reducing separation of the pressure-sensitive adhesive layer from the ring frame.

The embodiments may provide a dicing die-bonding film capable of preventing separation of a pressure-sensitive adhesive layer from a ring frame to help improve proccessability.

The embodiments may provide a non-UV type dicing die-bonding film having grooves in a region of an adhesive layer to be attached to a ring frame such that water and/or air supplied in a semiconductor manufacturing process may be discharged through the grooves, thereby preventing deterioration in adhesion to the ring frame and separation of the pressure-sensitive adhesive layer from the ring frame.

The embodiments may provide a dicing die-bonding film that is a non-UV type film and that may help prevent separation of a pressure-sensitive adhesive layer from a ring frame in a semiconductor manufacturing process.

For example, the dicing die-bonding film may have a groove formed in a region of the pressure-sensitive adhesive layer to be attached to the ring frame, such that cutting water (supplied in a sawing process) maybe discharged through the groove to protect the attachment region (between the pressure-sensitive adhesive layer and the ring frame) from water infiltration, thereby preventing deterioration in adhesion of the pressure-sensitive adhesive layer to the ring frame.

In addition, the dicing die-bonding film according to an embodiment may allow air supplied in a drying process (after the sawing process) to be discharged through the groove, thereby preventing air from being introduced into the attachment interface between the pressure-sensitive adhesive layer and the ring frame.

Further, the dicing die-bonding film according to an embodiment may be prevented from being separated from the ring frame, thereby improving pick-up proccessability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A dicing die-bonding film, comprising:
a base film;
a pressure-sensitive adhesive layer stacked on the base film; and
a bonding layer stacked on the pressure-sensitive adhesive layer,
wherein the pressure-sensitive adhesive layer includes:
a first region overlapping with the bonding layer, and
a second region not overlapping with the bonding layer, the second region including:
a third region adjacent to the first region, and
a fourth region adjacent to the third region and having a groove formed therein.

2. The dicing die-bonding film as claimed in claim 1, wherein a ring frame is attached to the fourth region.

3. The dicing die-bonding film as claimed in claim 1, wherein the groove has an apex at an interface between the third region and the fourth region.

4. The dicing die-bonding film as claimed in claim 1, wherein a distance from an end point of the groove to an end point of another groove neighboring the groove ranges from 1 mm to 15 mm.

5. The dicing die-bonding film as claimed in claim 1, wherein:
the groove is formed by cutting the dicing die-bonding film along a line connecting first to third points placed at different locations on the pressure-sensitive adhesive layer in order of the first, third, and second points or in order of the second, third, and first points,
the first point, the second point, and a central point of the pressure-sensitive adhesive layer are non-collinear,
a distance (a) from the central point of the pressure-sensitive adhesive layer to the first point, a distance (b) from the central point of the pressure-sensitive adhesive layer to the second point, and a distance (c) from the central point of the pressure-sensitive adhesive layer to the third point satisfy relationships of c<a and c<b, and
a shape of the lines connecting the first to third points is a straight line, a curved line, a wavy line, or an undulating line.

6. The dicing die-bonding film as claimed in claim 5, wherein the distance (a) is equal to the distance (b).

7. The dicing die-bonding film as claimed in claim 5, wherein a distance between the first point and the second point ranges from 1 mm to 15 mm.

8. The dicing die-bonding film as claimed in claim 5, wherein a minimal distance from the first point or the second point of the groove to a first point or second point of other groove neighboring the groove ranges from 1 mm to 15 mm.

9. The dicing die-bonding film as claimed in claim 5, wherein a vertical distance from a straight line extending between the first point and the second point to the third point ranges from 1 mm to 10 mm.

10. The dicing die-bonding film as claimed in claim 1, wherein the groove has a shape selected from a semicircular shape, an elliptical shape, a curved shape, a polygonal shape, or a combination thereof.

11. A dicing die-bonding film, comprising:
a base film;
a pressure-sensitive adhesive layer stacked on the base film;
a bonding layer stacked on the pressure-sensitive adhesive layer; and
a release film stacked on the bonding layer or the pressure-sensitive adhesive layer,
wherein the pressure-sensitive adhesive layer includes:
a first region overlapping with the bonding layer, and
a second region surrounding the first region without overlapping with the bonding layer, and
wherein at least one groove is formed through the base film and the second region.

12. The dicing die-bonding film as claimed in claim 11, wherein the groove does not penetrate the release film.

13. The dicing die-bonding film as claimed in claim 11, wherein a ring frame is attached to a section inside the second region.

14. The dicing die-bonding film as claimed in claim 11, wherein a distance from an end point of the groove to an end point of another groove neighboring the groove ranges from 1 mm to 15 mm.

15. The dicing die-bonding film as claimed in claim 11, wherein:
the groove is formed by cutting the dicing die-bonding film along a line connecting first to third points placed at different locations on the pressure-sensitive adhesive layer in order of the first, third, and second points or in order of the second, third, and first points,
the first point, the second point, and a central point of the pressure-sensitive adhesive layer are non-collinear,
a distance (a) from the central point of the pressure-sensitive adhesive layer to the first point, a distance (b) from the central point of the pressure-sensitive adhesive layer to the second point, and a distance (c) from the central point of the pressure-sensitive adhesive layer to the third point satisfy relationships of c<a and c<b and
a shape of the lines connecting the first to third points is a straight line, a curved line, a wavy line or an undulating line.

16. The dicing die-bonding film as claimed in claim 15, wherein the distance (a) is equal to the distance (b).

17. The dicing die-bonding film as claimed in claim 15, wherein a distance between the first point and the second point ranges from 1 mm to 15 mm.

18. The dicing die-bonding film as claimed in claim 15, wherein a minimal distance from the first point or the second point of the groove to first point or second point of another groove neighboring the groove ranges from 1 mm to 15 mm.

19. The dicing die-bonding film as claimed in claim 15, wherein a vertical distance from a straight line extending between the first point and the second point to the third point ranges from 1 mm to 10 mm.

20. The dicing die-bonding film as claimed in claim 11, wherein the groove has a shape selected from a semicircular shape, an elliptical shape, a curved shape, a polygonal shape, or a combination thereof.

21. A method of forming a groove in a dicing die-bonding film that includes a base film; a pressure-sensitive adhesive layer stacked on the base film; a bonding layer stacked on a central part of the pressure-sensitive adhesive layer; and a release film stacked on the bonding layer or the pressure-sensitive adhesive layer, the method comprising:
inserting a knife blade into the dicing die-bonding film from the base film to a depth penetrating a region of the pressure-sensitive adhesive layer, on which the bonding layer is not stacked, without penetrating the release film.

* * * * *